(12) United States Patent
Mohammadi et al.

(10) Patent No.: US 8,558,619 B2
(45) Date of Patent: Oct. 15, 2013

(54) SILICON-ON-INSULATOR HIGH POWER AMPLIFIERS

(71) Applicant: Purdue Research Foundation, West Lafayette, IN (US)

(72) Inventors: Saeed Mohammadi, Zionsville, IN (US); Sultan R. Helmi, West Lafayette, IN (US); Jing-Hwa Chen, West Lafayette, IN (US); Andrew J. Robison, West Lafayette, IN (US)

(73) Assignee: Purdue Research Foundation, West Lafayette, IN (US)

( * ) Notice: Subject to any disclaimer, the term of this patent is extended or adjusted under 35 U.S.C. 154(b) by 0 days.

(21) Appl. No.: 13/733,889

(22) Filed: Jan. 4, 2013

(65) Prior Publication Data

US 2013/0120065 A1    May 16, 2013

Related U.S. Application Data

(62) Division of application No. 13/044,989, filed on Mar. 10, 2011, now Pat. No. 8,368,469.

(60) Provisional application No. 61/312,288, filed on Mar. 10, 2010.

(51) Int. Cl.
  *H03F 3/16*    (2006.01)
(52) U.S. Cl.
  USPC ............................................. 330/277; 330/311
(58) Field of Classification Search
  USPC ................... 330/277, 311, 307, 295, 124 R
  See application file for complete search history.

(56) References Cited

U.S. PATENT DOCUMENTS 7,994,540 B2 *   8/2011   Nagy et al. ..................... 257/192
8,384,426 B2 *   2/2013   Or-Bach ......................... 326/39

* cited by examiner

*Primary Examiner* — Henry Choe
(74) *Attorney, Agent, or Firm* — Barnes & Thornburg LLP

(57) ABSTRACT

Illustrative embodiments of power amplifiers are disclosed. In one embodiment, a power amplifier includes a plurality of transistors formed on a silicon-on-insulator (SOI) substrate such that the plurality of transistors are each electrically isolated from one another within the SOI substrate. The power amplifier also includes a plurality of biasing networks, each biasing network being configured to dynamically bias at least one of the plurality of transistors. The plurality of transistors are electrically coupled in a series stack, with an output of the power amplifier being provided across the series stack.

20 Claims, 10 Drawing Sheets

SILICON-ON-INSULATOR HIGH POWER AMPLIFIERS

CROSS-REFERENCE TO RELATED APPLICATIONS

This is a divisional application of U.S. patent application Ser. No. 13/044,989, filed on Mar. 10, 2011, which in turn claimed priority to U.S. Provisional Patent Application Ser. No. 61/312,288, filed on Mar. 10, 2010, the entire disclosures of which are hereby incorporated by reference.

TECHNICAL FIELD

The present disclosure generally relates to radio-frequency (RF), microwave, and millimeter (mm) wave power amplifiers, which may be used in transmitter modules for wireless communication devices and radars, by way of example. More particularly, the present disclosure relates to circuit design topologies in which electrically isolated, complimentary metal-oxide-silicon (CMOS) transistors are stacked in series and biased using unique dynamic biasing approaches.

BACKGROUND

Scaling and other advances in silicon (Si) technology have brought about compact, high-performance SiGe bipolar and CMOS transistors and various RF, microwave, and mm-wave circuits implemented in Si technology. Si is an ideal technology for implementing an entire electronic system, as the various components of the system (e.g., digital, analog, memory, and RF components) can be integrated on a single substrate or chip. One bottleneck for Si-based, single-chip design in many applications is the implementation of a high-performance power amplifier.

While the feasibility of Si-based power amplifiers on a Si substrate has recently been demonstrated, commercially available designs provide relatively low output power and low-efficiency performance ("efficiency" being defined herein as the ratio of RF output power to the direct-current (DC) power dissipated by the circuit). The relatively poor performance of Si-based power amplifiers has been attributed to an inherent trade-off between the speed of a Si transistor and its breakdown voltages. As a result of this trade-off, high-speed Si transistors optimized for RF and microwave applications have relatively low breakdown voltages (e.g., ranging from about 1.2V to several volts). The output swing voltage of a Si power transistor is typically limited by the low breakdown voltage of the transistor, requiring an increase in the output signal current in order to boost the output power. Traditionally, the design of Si-based power amplifiers has been accomplished using wide transistors driven at very high currents. Parallel combinations of large transistors and power-combining architectures have also typically been necessary to boost the output power of the amplifier.

Some power amplifier designs relying on series-stacked transistors have been proposed. For example, J. Jeong et al., "A 20 dBm Linear RF Power Amplifier Using Stacked Silicon-on-Sapphire MOSFETs," 16 IEEE Microwave & Wireless Components Letters 684-686 (2006), the entire disclosure of which is expressly incorporated herein by reference, describes the use of stacked transistors in Silicon-on-Sapphire (SOS) and Silicon-on-Insulator (SOI) technologies to boost the output swing voltage and output impedance. S. Pornpromlikit et al., "A Watt-Level Stacked-FET Linear Power Amplifier in Silicon-on-Insulator CMOS," 58 IEEE Transactions on Microwave Theory & Techniques 57-64 (2010), the entire disclosure of which is expressly incorporated herein by reference, describes a similar approach. As explained in those references, the gate of each transistor is biased at a fixed voltage, and the voltage swings are therefore limited by the gate oxide breakdown. This limitation prevents stacking more than four transistors and/or applying large bias voltages.

U.S. Pat. No. 6,888,396 to A. Hajimiri et al. (Hajimiri), the entire disclosure of which is expressly incorporated herein by reference, presents several designs for stacking field-effect transistors (FET) and bipolar transistors to construct multi-cascode cells. The majority of the circuit designs described in Hajimiri are fixed gate-bias topologies and suffer from the drawbacks of gate oxide breakdown described above. The design presented in FIG. 9 of Hajimiri utilizes transformer coupling to overcome gate oxide breakdown but does not allow biasing of the gate-source of individual transistors (thus, resulting in low efficiency and precluding use in linear power amplifiers). The circuit design shown in FIG. 7 of Hajimiri, on the other hand, requires diodes that are not readily available in standard bulk and silicon-on-insulator (SOI) CMOS integrated circuit processes (thus, defeating the goal of a single substrate, without resort to a BiCMOS process).

The use of feedback resistors for the self-biasing of stacked FETs and bipolar transistors (in order to boost the output voltage of the amplifier) is described in J. G. McRory et al., "Transformer Coupled Stacked FET Power Amplifiers," 34 IEEE J. Solid-State Circuits 157-161 (1999), M. Lei et al., "Design and Analysis of Stacked Power Amplifier in Series-Input and Series-Output Configuration," 55 IEEE Transactions on Microwave Theory & Techniques 2802-2812 (2007), and U.S. Patent Publication No. 2009/0115529 to S. Chao et al., the entire disclosures of which are each expressly incorporated herein by reference. In theory, this approach protects the stacked structure from both source-drain reach-through and gate oxide breakdown under high voltage swings. In practice, however, introducing feedback resistors results in instability, particularly when the number of stacked transistors increases (thereby increasing the positive feedback signal). Thus, these designs are also limited to a maximum of four stacked transistors for optimum performance.

SUMMARY

The present invention comprises one or more of the features recited in the appended claims and/or the following features which, alone or in any combination, may comprise patentable subject matter:

According to one aspect, a power amplifier may comprise a plurality of amplifier cells each having an input and an output, the plurality of amplifier cells being formed on a semiconductor substrate such that the outputs of the plurality of amplifier cells are electrically coupled in series. Each of the plurality of amplifier cells may comprise a first transistor that is electrically insulated from the semiconductor substrate and a first feedback resistor configured to dynamically bias the first transistor.

In some embodiments, the first transistor may be electrically insulated from the semiconductor substrate by at least one of a buried oxide layer, an oxide trench, and an etched trench. The plurality of amplifier cells may comprise at least five amplifier cells. The power amplifier may further comprise a plurality of transformers, each of the plurality of transformers being configured to couple an input signal to the input of one of the plurality of amplifier cells. The plurality of transformers may be electrically coupled in series.

In other embodiments, each of the plurality of amplifier cells may further comprise a second transistor that is electrically insulated from the semiconductor substrate. The first and second transistors of each of the plurality of amplifier cells may be configured as a cascode amplifier. Each of the plurality of amplifier cells may further comprise a second feedback resistor configured to dynamically bias the second transistor. Each of the plurality of amplifier cells may further comprise a biasing network that includes the first feedback resistor and that is configured to dynamically bias the first and second transistors. Each of the plurality of amplifier cells may further comprise a diode-connected transistor configured to provide a direct current bias to the second transistor. Each of the plurality of amplifier cells may further comprise an inductor electrically coupled to the first transistor, the inductor being configured to tune out a parasitic capacitance between the first transistor and the semiconductor substrate.

According to another aspect, a power amplifier may comprise a plurality of silicon-on-insulator (SOI) transistors that are electrically coupled in a series stack, wherein an output of the power amplifier is provided across the series stack, and a plurality of biasing networks configured to dynamically bias each SOI transistor. The plurality of SOI transistors may comprise at least five SOI transistors in the series stack.

In some embodiments, the plurality of SOI transistors may be configured as a plurality of cascode amplifier cells, and each of the plurality of biasing networks may be configured to dynamically bias one of the plurality of cascode amplifier cells. Each of the plurality of biasing networks may comprise a first feedback resistor. Each of the plurality of biasing networks may further comprise a second feedback resistor. Each of the plurality of biasing networks may further comprise a diode-connected transistor. The power amplifier may further comprise an inductor and a capacitor electrically coupled in series between a node in the series stack and a ground node. The plurality of SOI transistors may be sized to provide an output impedance of about 50 ohms.

According to yet another aspect, a differential power amplifier may comprise a first stack of series-connected, dynamically biased transistors formed on a silicon-on-insulator substrate; a second stack of series-connected, dynamically biased transistors formed on the silicon-on-insulator substrate; and a plurality of inductors, each of the plurality of inductors coupling a node between a pair of transistors in the first stack to a corresponding node between a pair of transistors in the second stack. In some embodiments, the first stack may comprise a first plurality of cascode amplifier cells, each of the first plurality of cascode amplifier cells including two of the series-connected, dynamically biased transistors in the first stack, and the second stack may comprise a second plurality of cascode amplifier cells, each of the second plurality of cascode amplifier cells including two of the series-connected, dynamically biased transistors in the second stack.

BRIEF DESCRIPTION OF THE DRAWINGS

The detailed description particularly refers to the accompanying figures in which.

DETAILED DESCRIPTION OF THE DRAWINGS

Figure 1A:
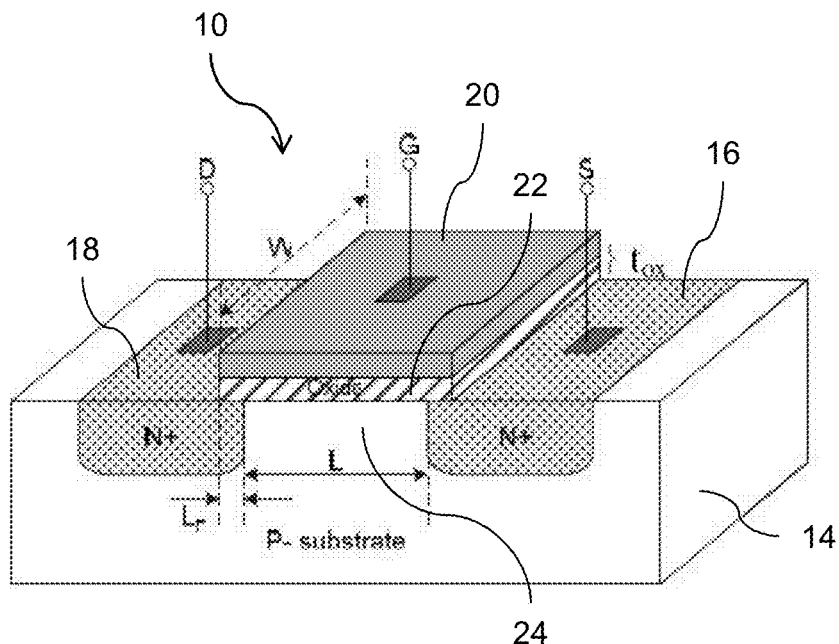
FIG. 1A illustrates one embodiment of a bulk CMOS transistor.

While the concepts of the present disclosure are susceptible to various modifications and alternative forms, specific exemplary embodiments thereof have been shown by way of example in the drawings and will herein be described in detail. It should be understood, however, that there is no intent to limit the concepts of the present disclosure to the particular forms disclosed, but, on the contrary, the intention is to cover all modifications, equivalents, and alternatives falling within the spirit and scope of the invention as defined by the appended claims.

In the following description, numerous specific details, such as types and interrelationships of circuit components, are set forth in order to provide a more thorough understanding of the present disclosure. It will be appreciated, however, by one skilled in the art that embodiments of the disclosure may be practiced without such specific details. In other instances, various circuit components have not been shown in detail (or not labeled in every instance) in order not to obscure the invention. Those of ordinary skill in the art, with the included descriptions, will be able to implement appropriate functionality without undue experimentation.

References in the specification to "one embodiment," "an embodiment," "an illustrative embodiment," etcetera, indicate that at least one embodiment described may include a particular feature, structure, or characteristic, but not every embodiment necessarily includes the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

Figure 1B:
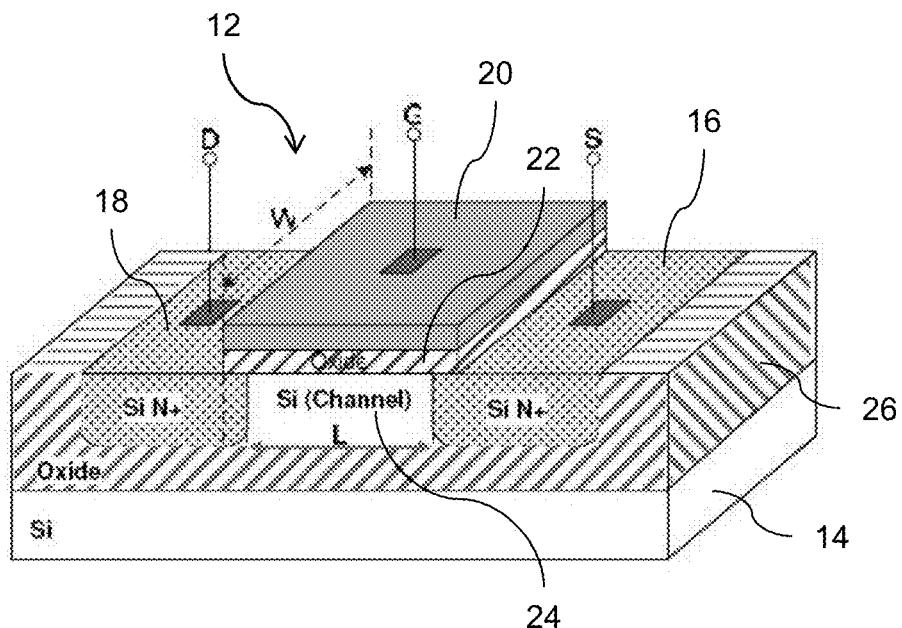
FIG. 1B illustrates one embodiment of an electrically isolated SOI CMOS transistor.

Exemplary CMOS transistors 10, 12 are illustrated in FIGS. 1A and 1B, each generally including a body 14, a source region 16, a drain region 18, a gate 20, a gate oxide 22, and a channel region 24. Like reference numerals are used to identify similar components between FIG. 1A, 1B, and all other figures in the present disclosure. The transistor 10 (shown in FIG. 1A) is fabricated using a bulk CMOS process in which the source and drain regions 16, 18 are formed in electrical contact with the body 14. By contrast, the transistor 12 (in FIG. 1B) is fabricated using a silicon-on-insulator (SOI) CMOS process in which the source and drain regions 16, 18 are formed on a very thin Si layer isolated from the bulk Si body 14 by a buried oxide (BOX) layer 26. Additionally or alternatively, oxide trenches may be formed around each transistor 12 to achieve electrical isolation from one another. As a result of the BOX layer 26 (and/or the oxide trenches), the transistor 12 is electrically isolated not only from the body 14 but also from any neighboring devices (i.e., other transistors 12). It is contemplated that, in other embodiments, the electrical isolation of transistor 12 may be achieved through trench isolation (which may be implemented as a post-processing step) or other appropriate processes.

Generally, in CMOS technology, the length (L) of the transistor channel 24 and the thickness ($t_{OX}$) of the gate oxide 22 are scaled down to improve the transconductance and the speed of the transistors 10, 12, while reducing parasitic capacitances. Such scaling, however, has the adverse effect of reductions in the breakdown voltage ($BV_{OX}$) of gate oxide 22 and in the source-drain reach-through voltage ($BV_{DS}$). The additional two voltage limitations in the bulk CMOS transistor 10 are the reverse-junction breakdown voltage ($BV_j$), which sets a limit on both the source-body voltage ($BV_{jS-B}$) and the drain-body voltage ($BVD_{jD-B}$), and the forward-bias drain-body voltage ($V_{jFWD}$), which sets a limit on the negative voltage that can be applied to either the drain region 18 or the source region 16 with respect to the body 14. For standard, digital CMOS technology, the two dominant breakdown mechanisms are $BV_{OX}$ and $BV_{DS}$ (which are often optimized to be similar to one another), while $BV_j$ and $V_{jFWD}$ are, to the first degree, not affected by scaling. A standard 0.25 µm bulk CMOS process may produce an illustrative transistor 10 with $BV_{OX}$=2.7V, $BV_{DS}$=3.0V, $BV_j$=10.5V, and $V_{jFWD}$=−1V.

When attempting to use bulk CMOS technology under a high voltage swing, several transistors 10 may be stacked in series. While this approach overcomes the small source-drain reach-through voltage for each CMOS transistor, it fails to improve power performance, as other breakdown mechanisms (e.g., $BV_j$), continue to limit the maximum drain voltage of the transistor 10. Due to the insulating nature of the BOX layer 26 (or the other isolation techniques described above), however, the SOI CMOS transistor 12 does not suffer from low $BV_j$ and $V_{jFWD}$. Thus, any number of electrically isolated transistors 12 may be stacked in series without practical limitation (for instance, up to the breakdown voltage of the BOX layer 26).

According to the present disclosure, electrically isolated transistors 12 (such as the SOI CMOS transistor 12, by way of illustrative example) are stacked in series using a unique topology that not only prevents premature gate oxide breakdown but also results in stable operation. As described herein, a relatively large number of stacked transistors 12 may be individually biased with dynamic biasing techniques to better isolate the input and output of the stacked amplifier circuit and, thus, prevent the amplifier from self-oscillation. These dynamic biasing techniques protect against premature gate oxide breakdown of the individual transistors 12 in the stack when large voltage swings are applied across the series combination. The number of transistors 12 that can be stacked is limited primarily by the BOX layer 26 breakdown voltage, which is typically between about 80V to about 300V. For a given output power, an increase in the output swing voltage of a stack with a large number of transistors facilitates a reduction in the signal current of each transistor. Utilizing oversized transistors 12 with relatively small currents improves the efficiency of the amplifier.

Figure 2:
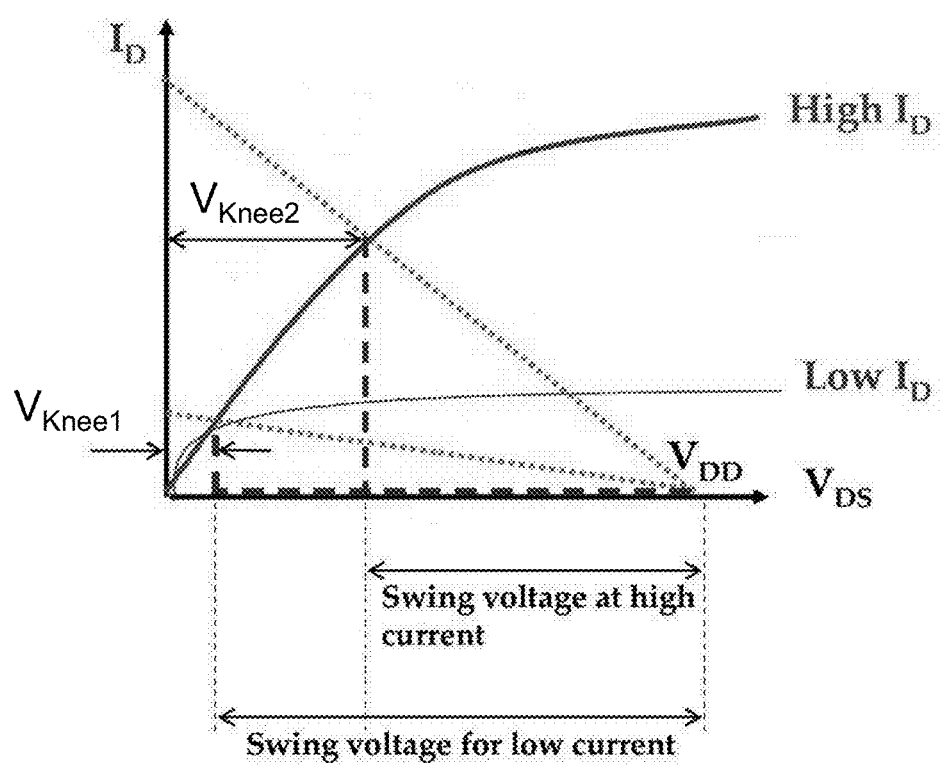
FIG. 2 illustrates how biasing individual transistors in a series-connected power amplifier at relatively low or relatively high currents can impact efficiency.

These principles may be best understood with reference to FIG. 2. As shown therein, a relatively small current (Low $I_D$) flowing in a transistor results in a relatively small knee voltage ($V_{Knee1}$). When the same transistor is driven at a relatively large current (High $I_D$), the knee voltage ($V_{Knee2}$) increases substantially, resulting in a smaller output voltage swing. The maximum power added efficiency (PAE) of a single transistor is limited to $\eta_{Knee}=[(V_{MAX}-V_{Knee})/V_{MAX}]^2$, where $V_{MAX}$ is the maximum voltage swing (typically, close to the breakdown voltage of the transistor). The breakdown voltage of GaAs and GaN transistors are often very high compared to their knee voltages, resulting in $\eta_{Knee}$ ratios approaching unity, and GaAs and GaN power amplifiers often achieve high PAEs.

Si-based transistors operating at high currents, on the other hand, are limited by their relatively small breakdown voltages and typically demonstrate $\eta_{Knee}$ ratios on the order of about 50% to about 90%. More advanced Si technologies often provide even lower $\eta_{Knee}$ ratios for power transistors, due to the inherent tradeoff between the breakdown voltage and the speed of a transistor. Thus, for advanced Si technologies, the only possibility to improve the $\eta_{Knee}$ ratio (e.g., to about 90%) is to drive a relatively large transistor at a relatively small drain current. As described herein, the stacking of SOI CMOS transistors 12 can be used to increase the overall output swing voltage and keep the output power relatively high.

In addition, the series stacking of transistors 12 may substantially reduce, or even eliminate, another PAE limiting mechanism: the power transfer ratio of impedance transformers ($\eta_{Transformer}$). The power transfer ratio of an impedance transformer depends on the losses of passive components and transmission lines and is typically in the range of about 50% to about 90%. In some embodiments, the use of a stacked transistor topology in SOI technology allows the elimination of impedance transformers all together. Instead, the overall impedance of the stack (i.e., the output impedances of the stacked transistors 12 added together) may be adjusted to 50Ω at the frequency of interest by optimizing the size and the number of transistors in the stack. By contrast, a 50Ω impedance environment cannot be achieved by designs based on parallel combination of transistors (due to their large effective capacitance), bringing down the equivalent impedance of the power amplifier at high frequencies and necessitating the use of an impedance transformer.

Figure 3A:
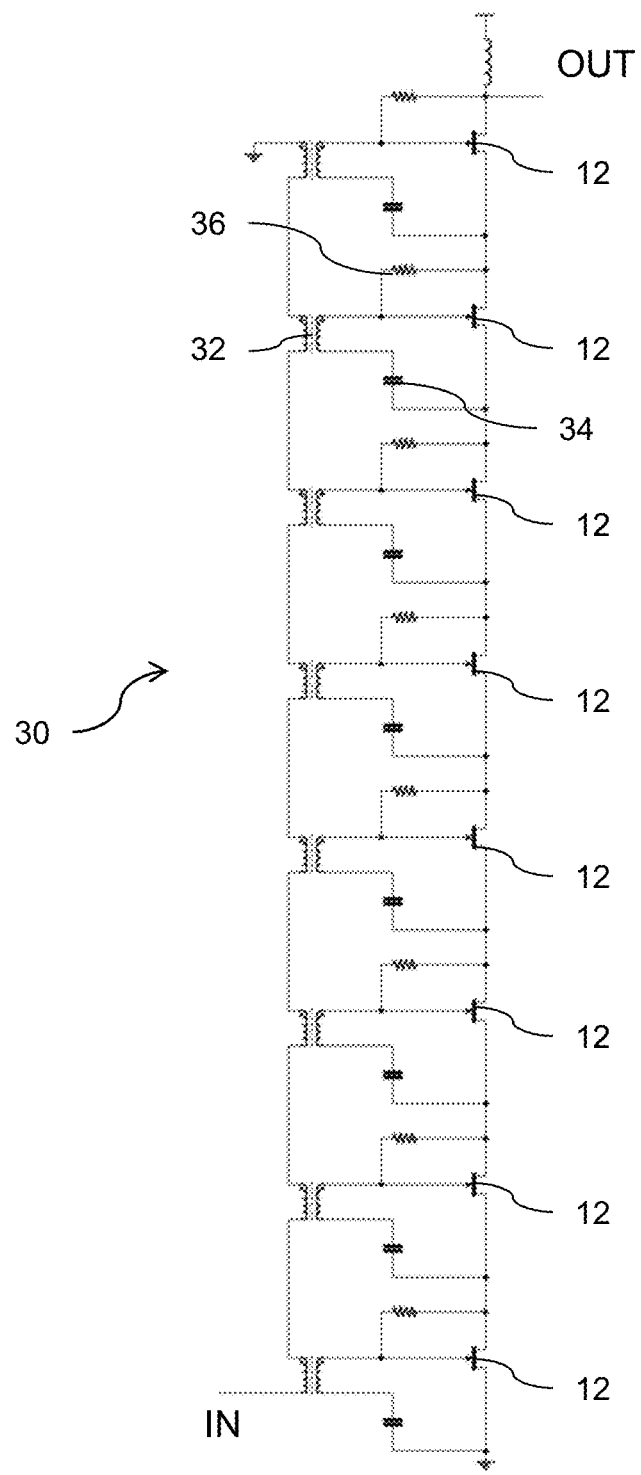
FIG. 3A illustrates one embodiment of a power amplifier including electrically isolated, dynamically biased common-source transistors.

Now referring to FIG. 3A, one illustrative embodiment of a power amplifier 30 includes eight dynamically biased, series stacked SOI CMOS transistors 12. In this embodiment, a transformer 32 couples the input signal to the gate of each stacked transistor 12. In other words, each stacked transistor 12 acts as an amplifier cell in the power amplifier 30. Although the power amplifier 30 shown in FIG. 3A uses a series-in configuration, it is also contemplated that other embodiments of the power amplifier may utilize parallel-in or a combination series-in/parallel-in configurations. Each of the stacked transistors 12 in the power amplifier 30 is arranged in a common-source configuration, with a capacitor 34 providing an AC ground with respect to the source of the transistor 12 at the end of the secondary winding of the transformer 32 that is not connected to the gate of the transistor 12. In this embodiment, each transistor 12 is dynamically biased by a feedback resistor 36.

Figure 3B:
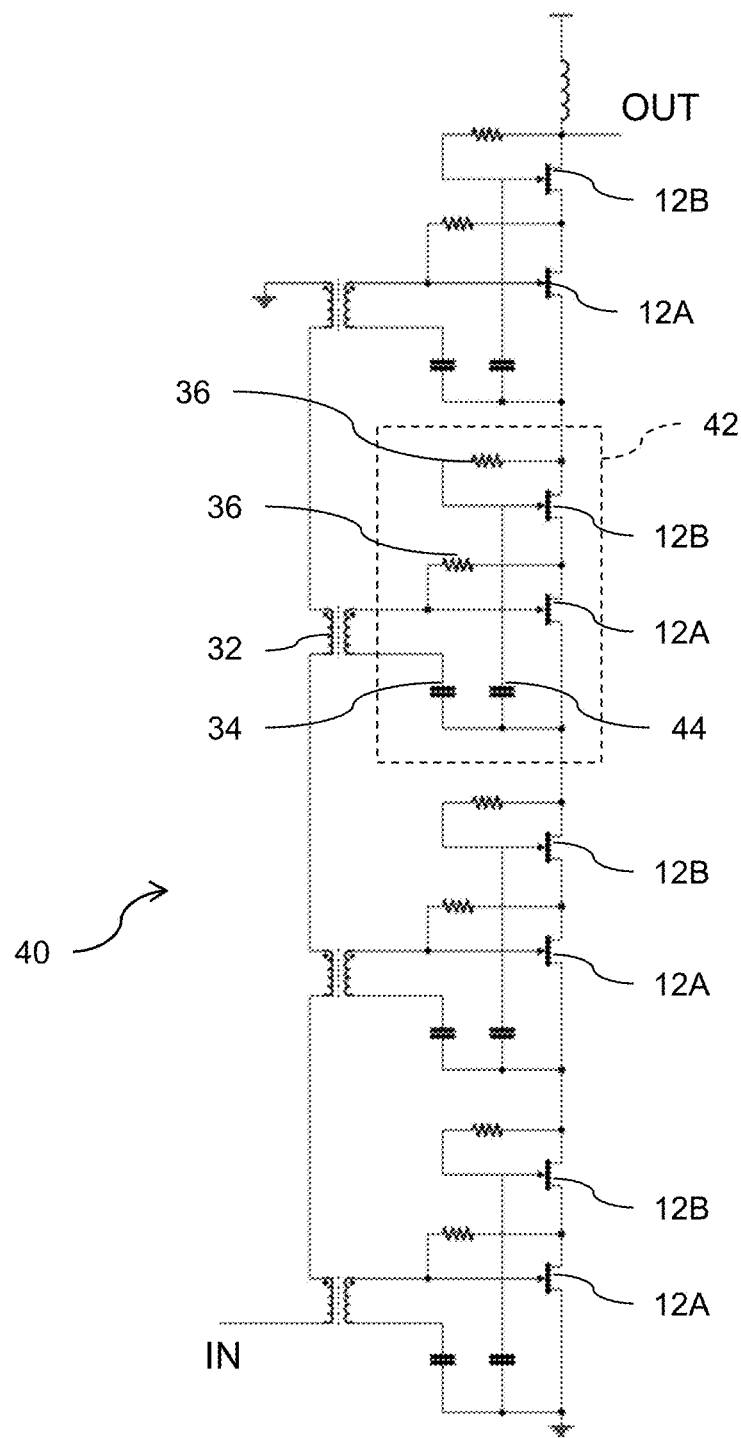
FIG. 3B illustrates one embodiment of a power amplifier including cascode cells with electrically isolated, dynamically biased transistors.

It will be appreciated that the embodiment of power amplifier 30 in FIG. 3A requires a number of transformers 32 that is equal to the number of stacked transistors 12. This large number of required transformers 32 may make the design bulky and unattractive. Additionally, this embodiment is more prone to instability due to the feedback resistors 36 used for dynamic biasing. FIG. 3B shows another illustrative embodiment of a power amplifier 40 that uses a number of stacked cascode amplifier cells 42 (instead of a common-source configuration for each transistor 12) to overcome these drawbacks. As can be seen in FIG. 3B, the power amplifier 40 uses half the number of transformers 32 of the power amplifier 30. As transformers formed on a Si substrate are often lossy, this embodiment provides higher gain and efficiency.

Figure 3C:
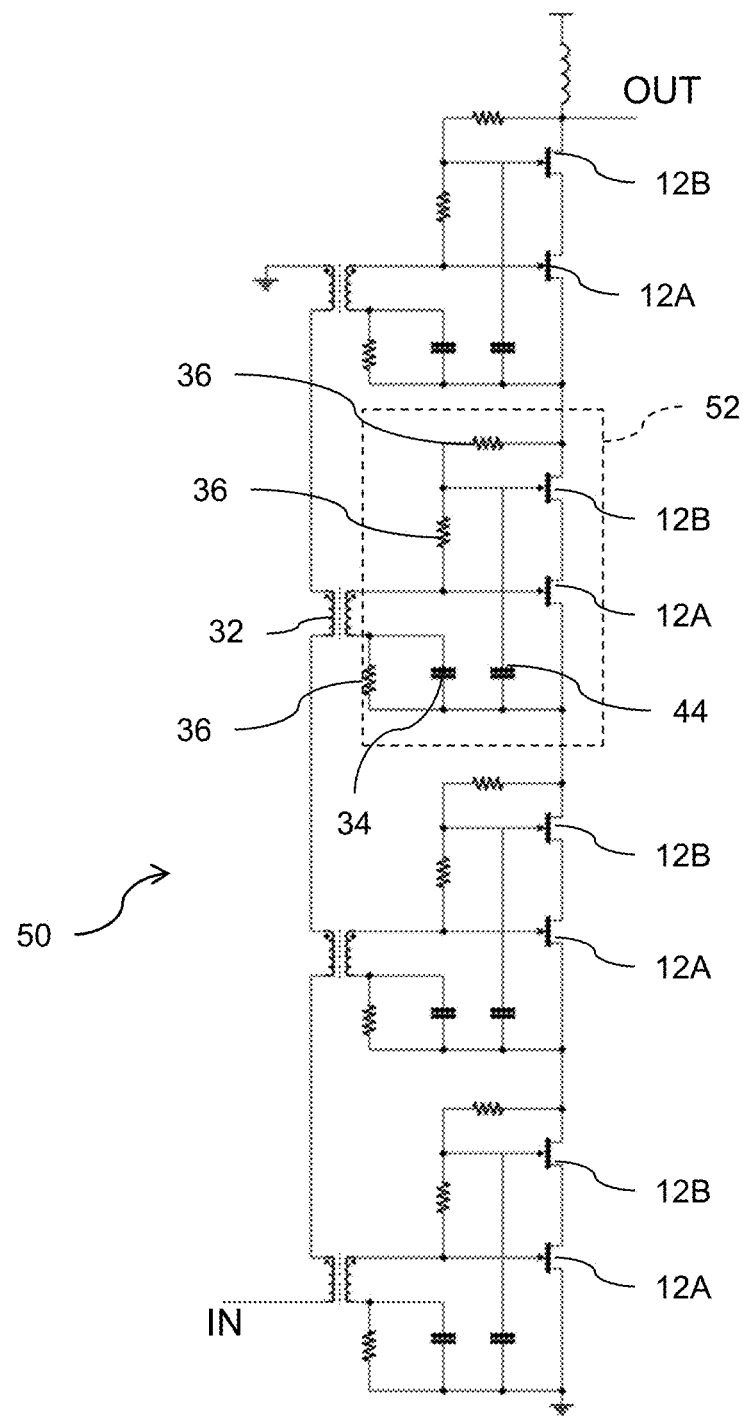
FIG. 3C illustrates another embodiment of a power amplifier including cascode cells with electrically isolated, dynamically biased transistors.

Each of the stacked cascode amplifier cells 42 of the power amplifier 40 includes two of the series stacked transistors 12A, 12B, each of which is dynamically biased by a feedback resistor 36. A capacitor 34 provides an AC ground with respect to the source of the transistor 12A at the end of the secondary winding of the transformer 32 that is not connected to the gate of the transistor 12A. A capacitor 44 provides an AC ground with respect to the source of transistor 12A at the gate of transistor 12B. FIG. 3C shows yet another illustrative embodiment of a power amplifier 50 that uses a number of stacked cascode amplifier cells 52 with a different dynamic biasing scheme. In this embodiment, instead of tapping the drain of each transistor 12A, 12B, only the drains of the common-gate transistors 12B are tapped with a network of feedback resistors 36 to provide dynamic biasing.

Figure 3D:
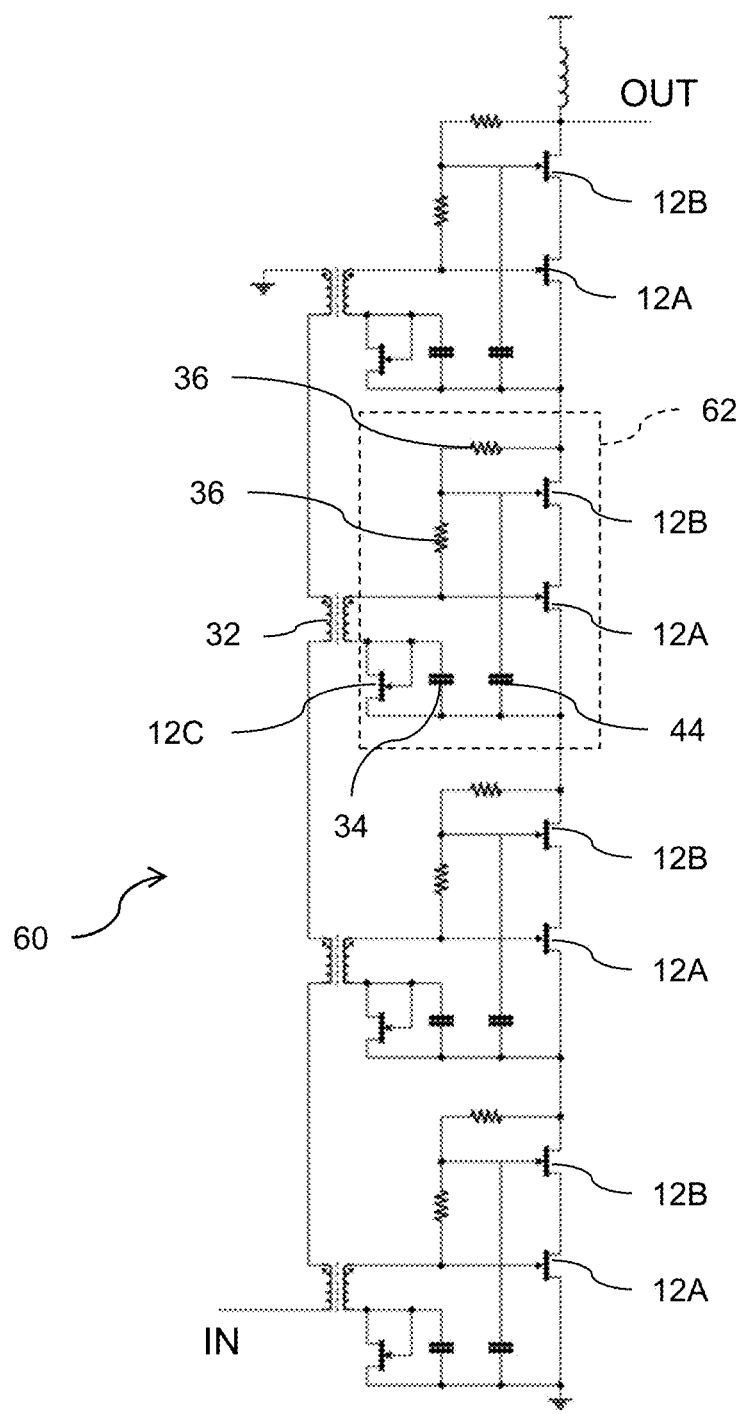
FIG. 3D illustrates yet another embodiment of a power amplifier including cascode cells with electrically isolated, dynamically biased transistors.

As shown in FIG. 3D, another illustrative embodiment of a power amplifier 60 may employ a number of stacked cascode amplifier cells 62 with yet another dynamic biasing scheme. In the cascode amplifier cells 62, a diode-connected transistor 12C provides DC biasing for the common-source transistor 12A. It is contemplated that, in some embodiments, transistor 12C may be a series stack of diode-connected transistors, depending on the bias voltage required at the gate of transistor 12A. Like the cascode amplifier cell 52 shown in FIG. 3C, only the drain terminals of common-gate transistors 12B of the cascode amplifier cells 62 are tapped to provide dynamic biasing (through a network of resistors 36 and the transistor 12C).

Figure 4:
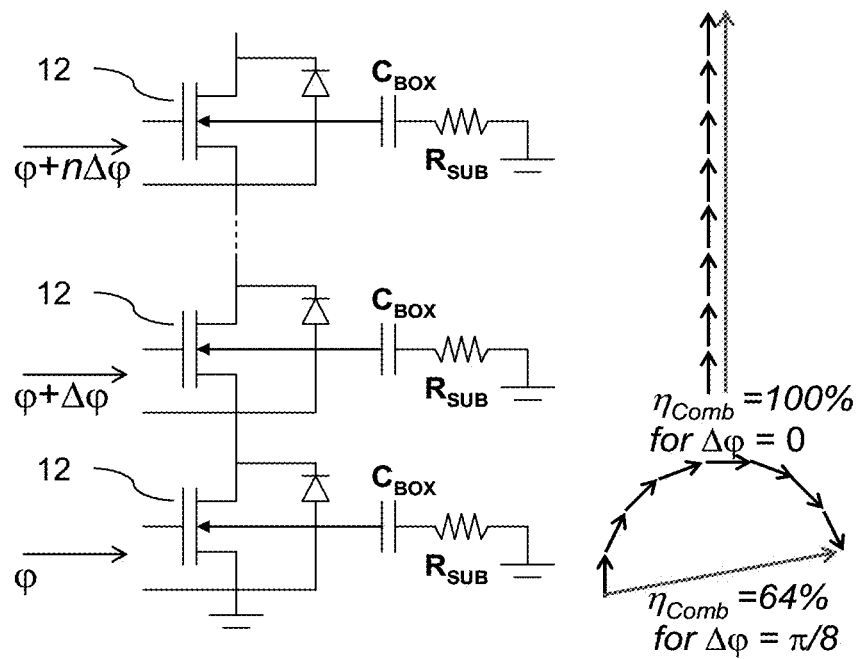
FIG. 4 illustrates an equivalent circuit of electrically isolated, dynamically biased transistors.

The use of dynamically biased, stacked SOI CMOS transistors 12 presents the additional challenge of ensuring that the output signals of the various amplifier cells are added together constructively. FIG. 4 depicts a simple equivalent circuit of the stacked transistors 12. As the transistors 12 are stacked on top of one another, the phase of the signals seen at the input of each transistor 12 should ideally be identical. In reality, because each transistor 12 has a parasitic capacitance to ground ($C_{BOX}$), the impedance seen at the input of each transistor 12 varies. As a result, the phases of the signal seen at the inputs of the transistors 12—which translate to the phase of signals added together at the output of the power amplifier—are not the same, and these signals do not add constructively. The right side of FIG. 4 illustrates the combining efficiencies for two different cases. When all phases are in sync and add constructively, the combining efficiency is 100%. When a phase difference exists among the stacked transistors 12 (illustrated as a constant phase difference of $\pi/8$ in FIG. 4), however, the combining efficiency drops to 64%. The combining efficiency sets an upper limit for the maximum PAE that can be achieved by a power amplifier. In addition, a phase imbalance may also result in the reduction of the output power for the same input power applied to the amplifier. While the phase difference is illustrated as constant in FIG. 4, the phase difference actually increases rather quadratically with the number of transistors 12. The issue of phase imbalance is another reason (in addition to the problem of breakdown voltages) that power amplifiers having more than four series stacked transistors have previously been unsuccessful.

Figure 5A:
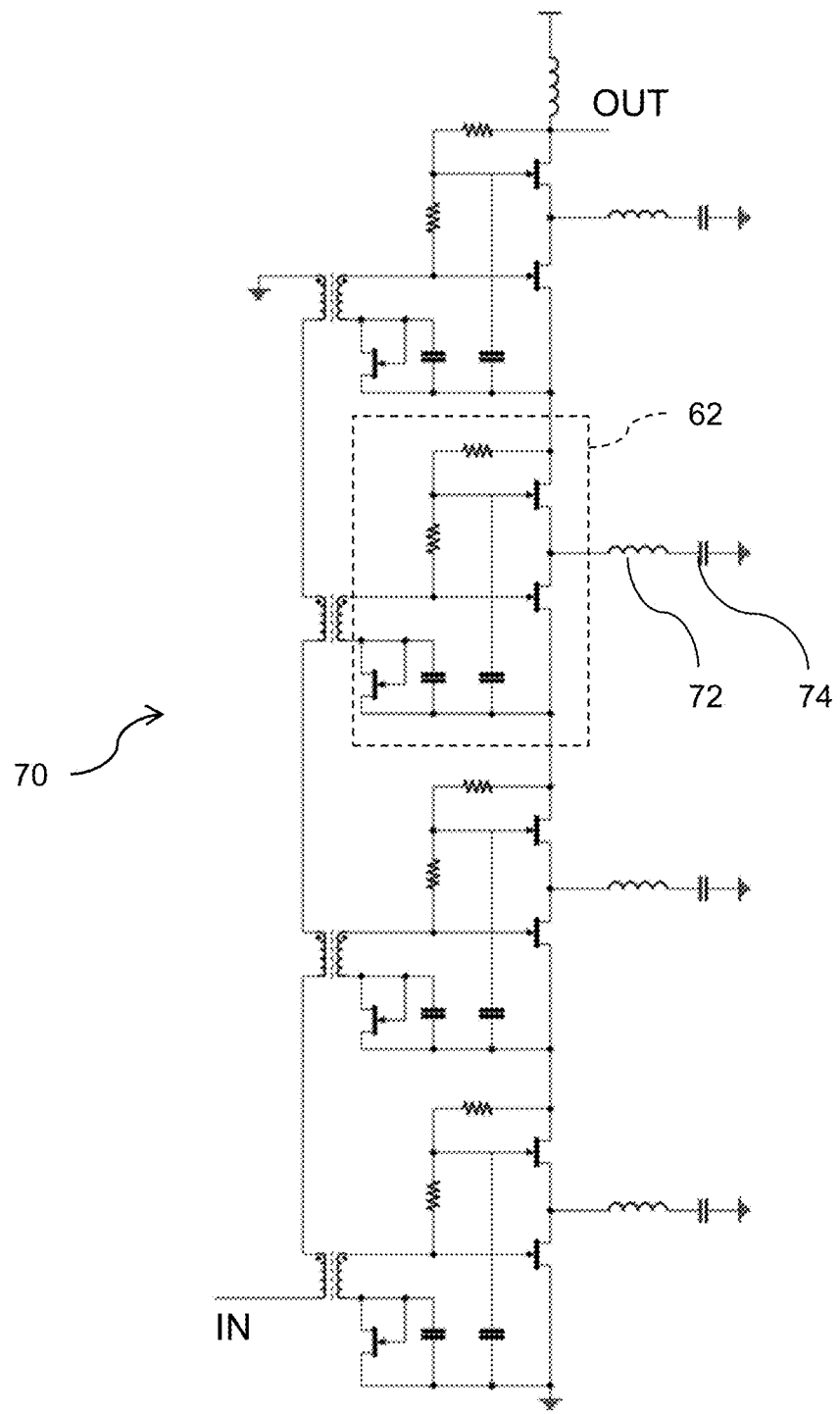
FIG. 5A illustrates one embodiment of a power amplifier that compensates for phase imbalance.
Figure 5B:
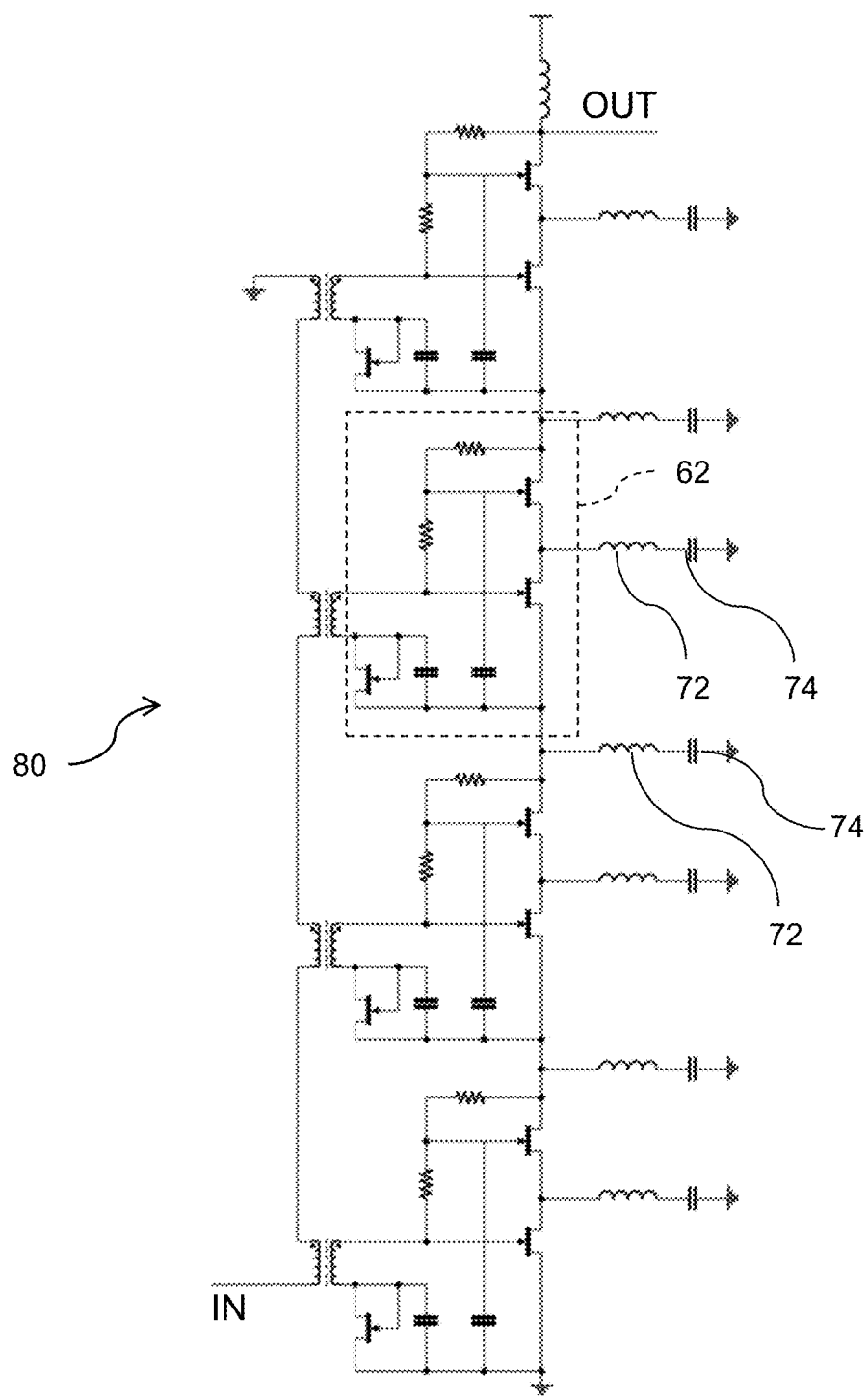
FIG. 5B illustrates another embodiment of a power amplifier that compensates for phase imbalance.

The illustrative embodiments of the power amplifiers 70, 80 shown in FIGS. 5A-B address this issue of phase imbalance in several ways. Although these modifications are illustrated based on the embodiment of power amplifier 60 (of FIG. 3D), it should be appreciated that a similar implementation could be applied to any of the other embodiments disclosed herein. The design of power amplifier 60 works well for lower frequencies and small transistor sizes, with small parasitic capacitances that result in small phase differences among the transistors 12. At higher frequencies and/or with larger transistors (required to achieve high output powers), parasitic capacitances at the common node of the transistors 12A, 12B in each cascode amplifier cell 62 introduce phase imbalance.

As shown in FIG. 5A, power amplifier 70 incorporates parallel inductors 72 to tune out these parasitic capacitances. An additional capacitor 74 (having a large capacitance with large breakdown voltage) may be added in series with each inductor 72 to maintain the DC bias, so as that the RF performance of the circuit is not affected. The inductors 72 tune out the parasitic capacitances and, thus, balance the phase among the transistors 12. As shown in FIG. 5B, power amplifier 70 incorporates parallel inductors 72 (with series capacitors 74) at every internal node of the stacked transistors 12. Alternatively, in other embodiments, a transmission line network may be used in place of the inductor 72 and the capacitor 74. Another design consideration to balance the phase of the stacked transistors 12 is to provide the input signal and obtain the output signal at the opposite ends of the stack (as shown in FIGS. 3A-D and 5A-B). By feeding the stack at the bottom, phase delays due to physical length of input transformers 32 are (at least somewhat) compensated by phase delays due to physical distance among the output nodes.

Figure 6:
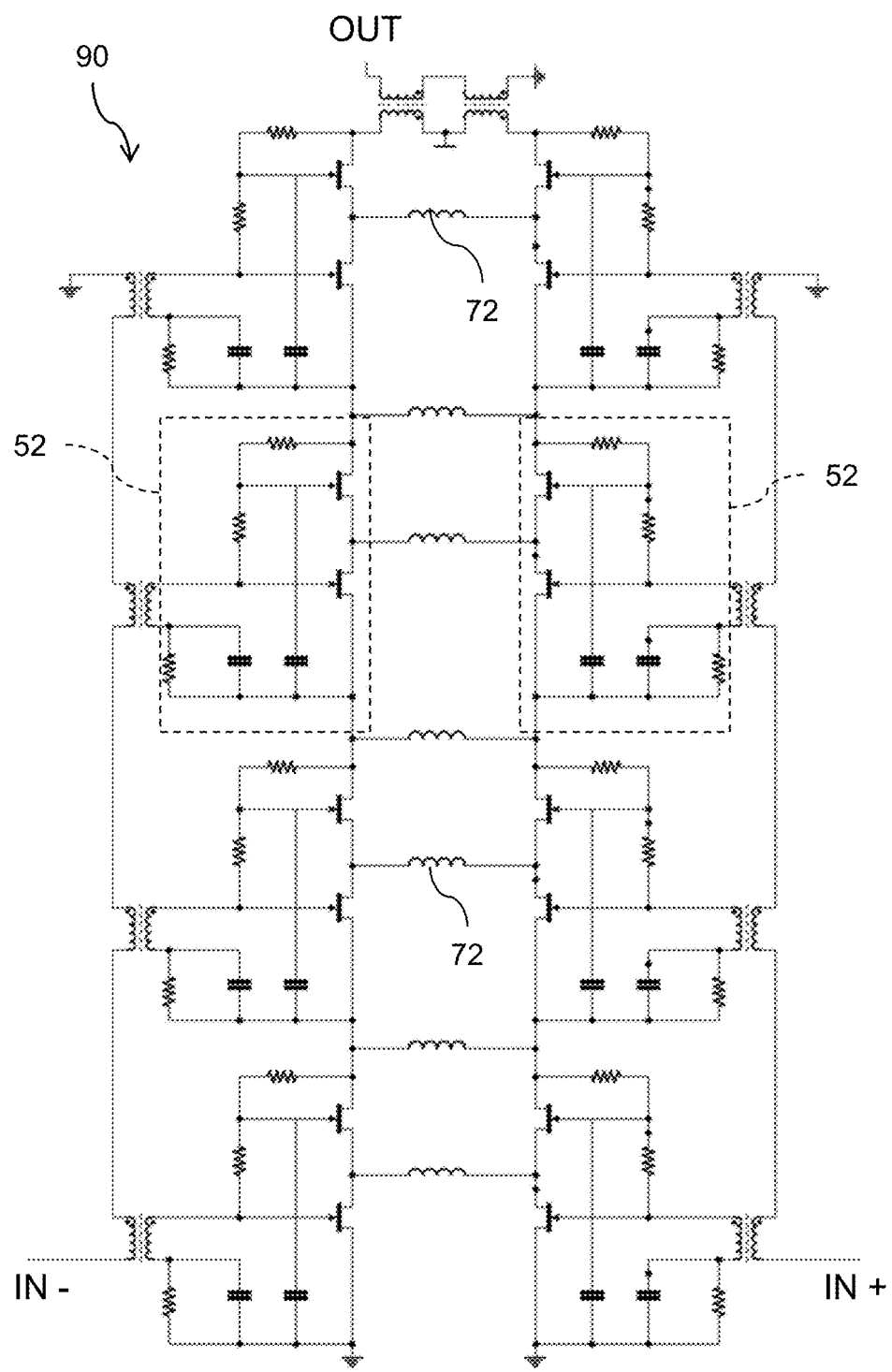
FIG. 6 illustrates one embodiment of a differential power amplifier.

One limitation of the embodiments shown in FIGS. 5A-B is the need for capacitors 74 with large capacitances and large breakdown voltage (especially the capacitor 74 that is connected to the top transistor 12 in the stack, which is subjected to the highest swing voltage). Such capacitors can be difficult to implement in Si-based technologies. Another illustrative embodiment of a power amplifiers 90, shown in FIG. 6, is configured as a differential power amplifier (based on the embodiment of power amplifier 50 of FIG. 3C). In this embodiment, the inductors 72 extend between corresponding nodes on opposite sides of the differential power amplifier 90. The power amplifier 90 eliminates the use of high voltage capacitors 74. Once again, it should be appreciated that such a differential design could be applied to any of the embodiments disclosed herein.

While most of the drawings of the present disclosure illustrate power amplifiers comprising eight stacked transistors 12, it is contemplated that any number of stacked transistors may be used in practice (for example, between about two and about eighty transistors 12). As previously mentioned, the only limit in stacking the transistors is the breakdown voltage of the BOX layer 26, which should remain greater than the overall swing voltage of the amplifier. Those of skill in the art will recognize that increasing the thickness of the BOX layer 26 will allow more transistors to be stacked. In other embodiments, the backside Si substrate (i.e., body 14) may be partially removed using deep reactive ion etching (DRIE) at locations where RF transistors with high voltage exist.

The illustrative designs of power amplifiers 30, 40, 50, 60, 70, 80, 90 disclosed herein may be applied to the design of power amplifiers in a wide range of frequencies from RF to mm-wave range. The size and number of transistors 12 are among some of the parameters that may be optimized for particular applications. Illustrative embodiments designed for cellular applications (W-CDMA and GSM) have shown excellent performance with output power in Watt levels and efficiencies above 40%. Even when the operational frequency was pushed to the K-band (e.g., 35 GHz), high output power (close to 1 W) and high efficiency (close to 40%) were achieved.

While the disclosure has been illustrated and described in detail in the drawings and foregoing description, such an illustration and description is to be considered as exemplary and not restrictive in character, it being understood that only illustrative embodiments have been shown and described and that all changes and modifications that come within the spirit of the disclosure are desired to be protected. There are a plurality of advantages of the present disclosure arising from the various features of the apparatus, systems, and methods described herein. It will be noted that alternative embodiments of the apparatus, systems, and methods of the present disclosure may not include all of the features described yet still benefit from at least some of the advantages of such features. Those of ordinary skill in the art may readily devise their own implementations of the apparatus, systems, and methods that incorporate one or more of the features of the present invention and fall within the spirit and scope of the present disclosure as defined by the appended claims.

The invention claimed is:

1. A power amplifier comprising:
   a plurality of transistors formed on a silicon-on-insulator (SOI) substrate such that the plurality of transistors are each electrically isolated from one another within the SOI substrate; and
   a plurality of biasing networks, each biasing network being configured to dynamically bias at least one of the plurality of transistors;
   wherein the plurality of transistors are electrically coupled in a series stack, an output of the power amplifier being provided across the series stack; and
      wherein at least one of the plurality of transistors is arranged in a common-gate configuration.

2. The power amplifier of claim 1, wherein the plurality of transistors are each electrically isolated from one another by a buried oxide layer.

3. The power amplifier of claim 1, wherein the plurality of transistors are each electrically isolated from one another by oxide trenches.

4. The power amplifier of claim 1, wherein the plurality of transistors are electrically coupled in the series stack via metal interconnects.

5. The power amplifier of claim 1, wherein the plurality of transistors comprises at least five transistors electrically coupled in the series stack.

6. The power amplifier of claim 1, wherein the plurality of transistors are sized to provide an impedance of about 50 ohms at the output of the power amplifier.

7. The power amplifier of claim 1, wherein each of the plurality of biasing networks comprises a first feedback resistor electrically coupled between a drain terminal and a gate terminal of one of the plurality of transistors.

8. A power amplifier comprising:
   a plurality of transistors formed on a silicon-on-insulator (SOI) substrate such that the plurality of transistors are each electrically isolated from one another within the SOI substrate; and
   a plurality of biasing networks, each biasing network being configured to dynamically bias at least one of the plurality of transistors;
   wherein the plurality of transistors are electrically coupled in a series stack, an output of the power amplifier being provided across the series stack; and
   wherein at least two of the plurality of transistors are arranged as a cascode amplifier, at least one transistor of the cascode amplifier being arranged in a common-gate configuration.

9. A power amplifier comprising:
   a plurality of cascode amplifiers formed on a silicon-on-insulator (SOI) substrate, each of the plurality of cascode amplifiers including at least two transistors that are electrically isolated from one another within the SOI substrate, at least one transistor of each of the plurality of cascode amplifiers being arranged in a common-gate configuration; and
   a plurality of biasing networks, each biasing network being configured to dynamically bias the transistors of one of the plurality of cascode amplifiers;
   wherein the plurality of cascode amplifiers are electrically coupled in a series stack, an output of the power amplifier being provided across the series stack.

10. The power amplifier of claim 9, further comprising a plurality of transformers electrically coupled in series, each of the plurality of transformers being configured to couple an input signal to one of the plurality of cascode amplifiers.

11. The power amplifier of claim 9, wherein each of the plurality of biasing networks comprises a first feedback resistor and a second feedback resistor.

12. The power amplifier of claim 11, wherein each of the plurality of biasing networks further comprises a diode-connected transistor configured to provide a direct current bias to at least one transistor of one of the plurality of cascode amplifiers.

13. The power amplifier of claim 1, further comprising a plurality of inductors electrically coupled to the plurality of transistors, each of the plurality of inductors being configured to tune out a parasitic capacitance between one of the plurality of transistors and the SOI substrate.

14. The power amplifier of claim 8, wherein the plurality of transistors are each electrically isolated from one another by a buried oxide layer.

15. The power amplifier of claim 8, wherein the plurality of transistors are each electrically isolated from one another by oxide trenches.

16. The power amplifier of claim 8, wherein the plurality of transistors are electrically coupled in the series stack via metal interconnects.

17. The power amplifier of claim 8, wherein the plurality of transistors comprises at least five transistors electrically coupled in the series stack.

18. The power amplifier of claim 8, further comprising a plurality of inductors, each of the plurality of inductors electrically coupled to one or more of the plurality of transistors and being configured to tune out a parasitic capacitance between one or more of the plurality of transistors and the SOI substrate.

19. The power amplifier of claim 9, wherein the plurality of cascode amplifiers are electrically coupled in the series stack via metal interconnects.

20. The power amplifier of claim 9, further comprising a plurality of inductors, each of the plurality of inductors electrically coupled to one or more of the transistors of one of the plurality of cascode amplifiers and being configured to tune out a parasitic capacitance between one or more of the transistors and the SOI substrate.

* * * * *